United States Patent [19]

Sugano

[11] 4,405,929

[45] Sep. 20, 1983

[54] THERMAL HEAD DEVICE

[75] Inventor: Osamu Sugano, Ikeda, Japan

[73] Assignee: Ricoh Company, Ltd., Japan

[21] Appl. No.: 277,999

[22] Filed: Jun. 26, 1981

[30] Foreign Application Priority Data

Jun. 27, 1980 [JP] Japan .................................. 55-87515
Jul. 3, 1980 [JP] Japan .................................. 55-90999

[51] Int. Cl.³ ........................ H05H 1/00; G01D 15/10
[52] U.S. Cl. ................................ 346/76 PH; 219/216
[58] Field of Search ....................... 346/76 R, 76 PH; 219/216, 216 PH

[56] References Cited

U.S. PATENT DOCUMENTS 3,632,969 1/1972 Walkow ...................... 346/76 PH X
4,099,046 7/1978 Boynton et al. .................... 219/216
4,123,647 10/1978 Oda ............................. 219/216 PH
4,141,018 2/1979 Mizuguchi et al. ...... 219/216 PH X Primary Examiner—Donald A. Griffin
Attorney, Agent, or Firm—Guy W. Shoup; Eliot S. Gerber; Gerard F. Dunne

[57] ABSTRACT

A thermal head device for use in a facsimile machine and the like as an output device is provided. The thermal head device comprises a plurality of heat-producing electrically resistive elements formed on an insulating substrate arranged in a single line to form a thermal array. A plurality of tape carriers, each comprised of an insulating film strip and conductive paths formed thereon in a desired pattern, are used to provide interconnections between the resistive elements and external circuits. An image information signal is applied to the resistive elements through the tape carriers thereby the resistive elements are selectively activated to produce heat in accordance with the signal supplied. Therefore, a visual image may be obtained by advancing a thermo-sensitive paper in contact with the thermal array in the direction perpendicularly thereto. The present invention provides numerous improvements in such a thermal head device.

30 Claims, 38 Drawing Figures

F I G. 17
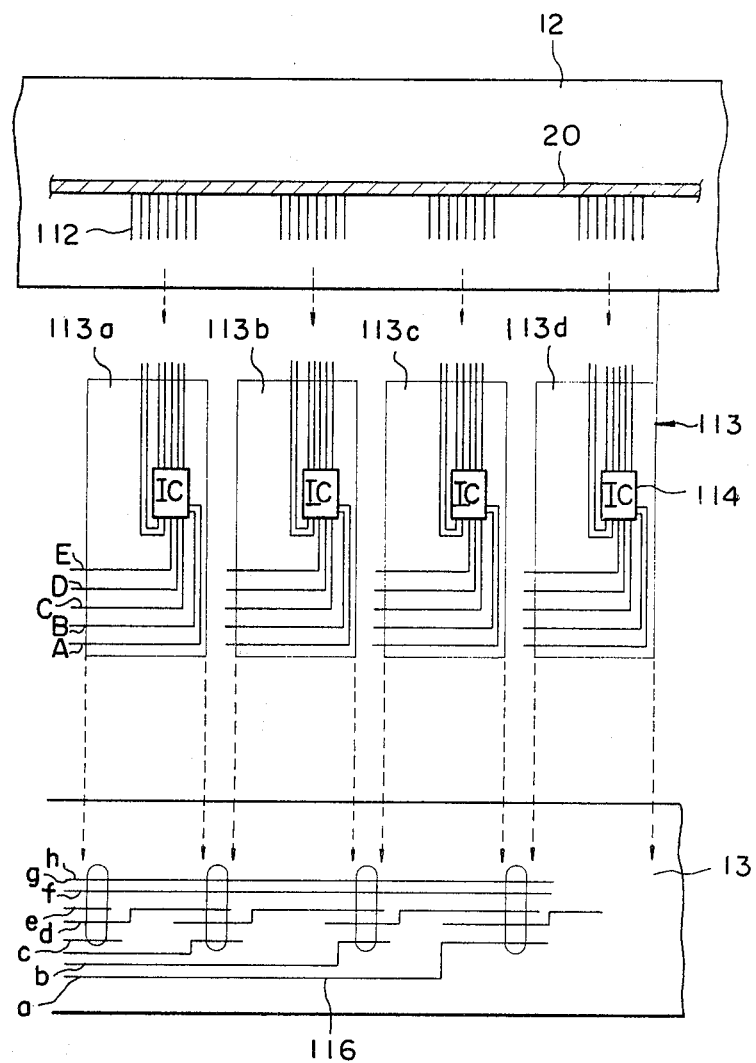

THERMAL HEAD DEVICE

BACKGROUND OF THE INVENTION

1. Field of the Invention

This invention generally relates to an output device of an information processing system such as facsimile. More in particular, this invention relates to a thermal head device which converts electrical signals into heat signals whereby a thermosensitive paper is brought into contact to obtain a visual image, corresponding to the electrical signals transmitted.

2. Description of the Prior Art

Facsimile machines have been increasingly used to save time in communication between remote places. A facsimile machine includes an output device for converting electrical signals received into visual signals for the ease of understanding the received information. Several different types of such a facsimile output device have been proposed. For example, a well-know electrostatic imaging system, extensively used in electrophotographic copying machines, has been applied to the output device of a facsimile machine. This type of the output device tends to be bulky and requires numerous components, which, in turn, pushes up the manufacturing cost. It is also subjected to the limitation in speed which is inherent to the electrostatic imaging technology.

The current trend is to use a thermal head type output device for converting electrical signals into thermosignals which are applied to a thermosensitive paper for visualization of the electrical information. The thermal head device as the output device of a facsimile machine and the like includes a number of heat-producing resistive elements formed in a single array on a substrate, which elements are individually activated under control. Each of the heat-producing resistive elements, which produce heat in response to electric currents passed therethrough, corresponds to a picture element. Thus, in order to obtain a visualized image of good quality, e.g., high resolution, it is required to provide many picture elements, or resistive elements per unit length. From a practical viewpoint, the resolution of 8 elements/mm will be required, which, in turn, indicates that 1,728 elements must be provided for scanning the width of DIN A4 size paper.

As described above, the thermal head device as an output device for a facsimile and the like are not free from disadvantages which mainly stem from the requirement to provide so many resistive elements. Thus, there is much room for improvements in the thermal head device as proposed herein.

SUMMARY OF THE INVENTION

The disadvantages of the prior art are overcome with the present invention and an improved thermal head device for use in a facsimile machine and the like is provided.

In accordance with the present invention, there is provided an improved thermal head device which is generally comprised of a support plate on which are mounted a center substrate and a pair of side substrates each provided on the opposite sides of the center substrate, and a plurality of tape carriers, each of which is provided to bridge between the center substrate and either of the two side substrates. Preferably, either of the substrates and the tape carriers are made of an electrically insulating material. Electrically conductive paths are formed on the surface of each of the substrates and the tape carriers, and, therefore, when the tape carriers are mounted to bridge between the center and side substrates, the conductive paths of the tape carriers provide interconnections between certain conductive paths of the center substrate and certain conductive paths of either of the side substrates.

A plurality of heat-producing electrically resistive elements are formed on the surface of the center substrate in the form of a single array which is also referred to as a thermal array hereinbelow. Such a resistive element may be made of any material which produces heat in response to an electrical current signal supplied thereto. Preferably, use may be made of $Ta_2N$ as a material for the resistive elements. The resistive elements are grouped into a certain number of blocks and each of the blocks includes a predetermined number of the resistive elements, whereby the number of the tape carriers correspond to the number of the blocks of the resistive elements. Preferably, an IC chip is mounted on each of the tape carriers and the IC chip controls activation and deactivation of each of the resisitve elements in the corresponding block.

In accordance with one aspect of the present invention, conductive paths for respective blocks are provided on the center substrate on opposite sides alternately with respect to the array of the resistive elements. Each of the conductive paths in one block has a lateral portion which generally extends in parallel with the lengthwise direction of the thermal array. These lateral portions in one block are arranged spaced apart from each other in the direction generally perpendicular to the lengthwise direction of the thermal array. With such a structure, it is only necessary to prepare tape carriers of the same type which may be used on either side of the thermal array. This can greatly simplify the manufacturing process and reduce the manufacturing cost.

In accordance with another aspect of the present invention, driving means for driving or activating the resistive elements in the thermal array preferably comprises an IC chip provided for each block of the thermal array. The IC chip preferably comprises transistor switching means connected individually to the resistive elements of the corresponding block. The IC chip also comprises a shift register having bits corresponding in number to the resistive elements of each block. All of the shift registers on one side with respect to the lengthwise direction of the thermal array are connected in series; whereas all of the shift registers on the other side are also connected in series. The driving means further comprises distributing means for distributing signals to the IC chips on one side and to the IC chips on the other side alternately every predetermined number of signals. Preferably, the distributing means includes a counter for counting the predetermined number of signals and a flipflop for changing the side to which signals are to be fed. With such a structure, the whole device may be made compact in size. Moreover, the operational speed may be significantly increased.

In accordance with a further apsect of the present invention, each of the resistive elements is comprised of a central heating portion of a serpentine-like shape and pre-heating portions each provided at one end of the central heating portion. The central heating portion has a narrower width with an effectively extended length, which implies an effectively increased electrical resistance at the central portion. Preferably, a cut-away portion is provided between the heating and pre-heating portions to further improve the thermal response characteristics. Moreover, an auxiliary heating portion is provided at a bent of the serpentine-like heating portion to avoid thermal concentration. With such a structure, thermal characteristics of the resistive elements are significantly improved so that a high-speed thermal head device may be provided.

In accordance with a still further aspect of the present invention, a particular electrode arrangement is provided to simplify structure. Preferably, the resistive elements of the thermal array is divided into a certain number of blocks or groups, each block having a predetermined number of resistive elements, and first and second electrodes are connected to respective sides of each of the resistive elements, whereby all of the first electrodes in one block are provided on one side of the thermal array with all of the first electrodes in the block adjacent to said one block being provided on the opposite side of the thermal array, said second electrode being common to all of the resistive elements in the thermal array. This structure reduces the number of independent electrodes, which could contribute to lower the manufacturing cost and to assure a high speed operation.

In accordance with a still further aspect of the present invention, several different kinds of tape carriers are provided to further improve the present thermal head device. Tape carriers generally of the same type except having outer connection leads at different positions are provided for the ease of the maintenance of the thermal head device. A stacked tape carrier having at least two film strips superposed one on another is provided to accommodate the increased number of conductive paths required for multifunction purposes. A tape carrier having a cross-over or cross-under at the intersection of the conductive paths is provided whereby the connection leads at the ends of the conductive paths may be arranged in any desired fashion. A tape carrier having an IC chip, which includes transistors for individually activating and deactivating the resistive elements and a shift resistor for receiving and transferring information signals, is provided. There is also provided a tape carrier comprising a film strip having an opening for an IC chip, whereby conductive paths for output signals and conductive paths for input signals are provided on opposite side surfaces of the film strip with connection leads at the ends of the conductive paths extending beyond the sides of the film strip. With such a tape carrier, an IC chip having contact electrodes on one side may be easily mounted on the film strip by bringing the contact electrodes of the IC chip into contact with the corresponding connection leads of the film strip. When an IC chip is mounted on the film strip of a tape carrier, it is preferable that the chip is mounted without turning upside down.

Accordingly, it is an object of the present invention to provide an improved thermal head device for use in a facsimile machine and the like as the output device.

Another object of the present invention is to provide a thermal head device which is simple in structure, and, therefore, easy to manufacture with a significantly reduced manufacturing cost.

A further object of the present invention is to provide a thermal head device which can insure a high speed operation and requires a minimum of maintenance.

A still further object of the present invention is to provide a thermal head device which is compact in size, and, therefore, enables to make a facsimile machine remarkably smaller when assembled therein.

A still further object of the present invention is to provide a thermal head device which requires a minimum of wiring or bonding operation thereby enabling to provide a reliable thermal head device.

Other objects, advantages and novel features of the present invention will become apparent from the following detailed description of the invention when considered in conjunction with the accompanying drawings.

BRIEF DESCRIPTION OF THE DRAWINGS

FIG. 17 is a schematic illustration showing how the tape carriers are used to form interconnections between the center and side substrates;

DESCRIPTION OF THE PREFERRED EMBODIMENTS

Figure 1:
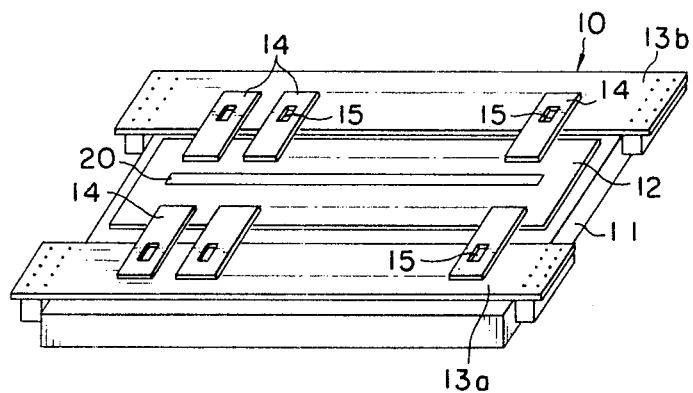
FIG. 1 is a perspective view illustrating the overall structure embodying the present invention.

Referring now to FIG. 1, there is schematically shown a thermal head device 10 which generally comprises a support plate 11 of a rectangular shape, preferably made of a metal such as Al or iron, a center substrate 12, preferably of ceramics, mounted on and at the center of the support plate 11, a pair of side substrates 13a and 13b, preferably of glass epoxy, mounted on the support plate 11 each on one side of the center substrate 12 and in parallel with respect thereto, and a plurality of tape carriers 14, preferably of insulating film strips, arranged in two lines spaced apart from each other with each tape carrier 14 bridging between the center substrate 11 and either of the two side substrates 13a and 13b. It is to be noted that only some of the tape carriers 14 are shown in FIG. 1. It should also be noted that each of the substrates 12, 13a and 13b is preferably made of an insulating material and conductive paths are formed on at least one surface thereof, preferably in a printed pattern, though none of the conductive paths is shown in FIG. 1. Each of the tape carriers 15 is provided with a through-hole in which an electronic component 15 such as an IC chip is mounted.

At the center of the top surface of the substrate 12 and extending in the lengthwise direction thereof is provided a thermal array 20 as illustrated schematically. Although details are not shown in FIG. 1, the array 20 comprises a plurality of heat-producing electrically resistive elements, e.g., 8 elements/mm, preferably formed by $Ta_2N$. It is to be noted that there are basically two ways to form the array 20. In one way, a plurality of resistive islands are formed along the array, which islands are spaced apart and electrically insulated from each other. Alternatively, the array 20 may simply include an elongated continuous layer of $Ta_2N$ with the provision of a number of paired electrodes along the array to define sections of the resistive elements. In this specification, the "thermal array" 20 is used to include the above two alternatives.

As may be easily understood, the tape carriers 14 provide interconnections between the substrate 12 and either of the substrates 13a and 13b. Thus, electrical signals fed to the thermal head device 10 proceed along the conductive paths and finally reach the thermal array 20 through the IC chips 15 to produce heat locally along the expanse of the array 20 in accordance with the signals fed. As a result, if a thermosensitive paper is brought into contact with the thermal array 20, a visual image may be obtained. Naturally, such a thermosensitive paper must be advanced in the direction perpendicular to the lengthwise direction of the array 20 while keeping contact therewith to obtain a visual image on a two dimensional plane.

Figure 2:
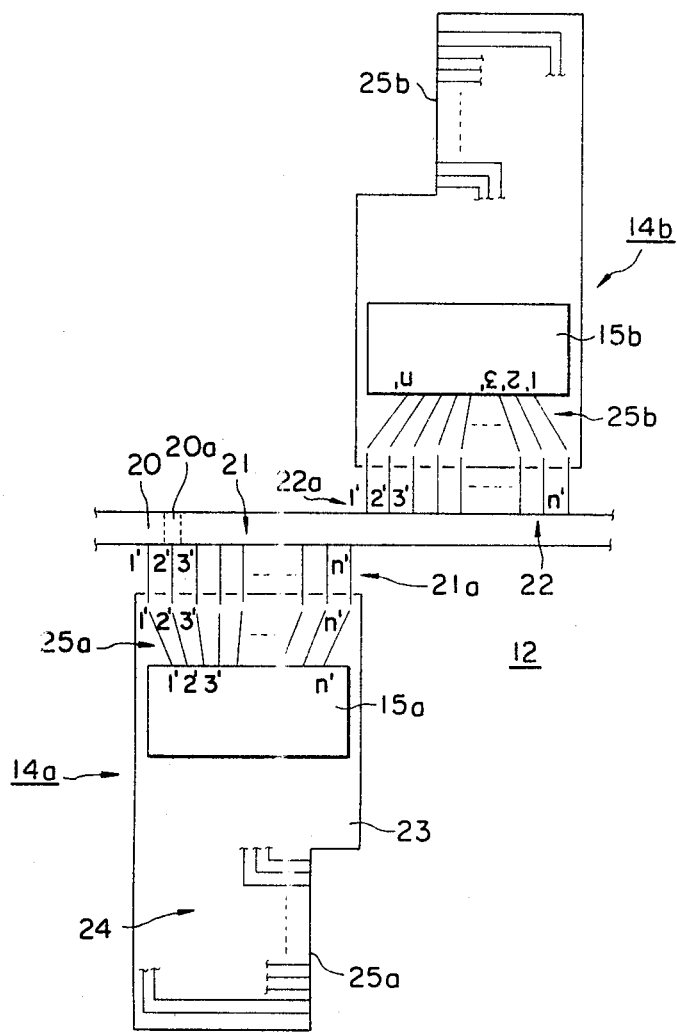
FIG. 2 is a schematic illustration showing the case where tape carriers of the same type may not be used on both sides of the thermal array.

Now, reference will be had with respect to FIG. 2 which shows the connection between the thermal array 20 of the center substrate 12 and the tape carriers 14a and 14b. In FIG. 2, only two tape carriers 14a and 14b are shown one on each side of the array 20, but it should be understood that a plurality of such tape carriers are provided on either side of the array 20.

Before going into detailed discussions, it should be understood as a basic knowledge that the thermal array 20 which includes a plurality of picture elements aligned in a single line is scanned from one end to the other. The use of line scanning technique allows to reduce the number of wiring as compared with the case in which simultaneous operation of all of the picture elements in the array 20 is intended, and, therefore, it is often used for practical purposes when the number of picture elements is rather significant as in the present invention. When such line scanning technique is to be applied, it is common practice to divide the array of picture elements into a certain number of blocks or groups, each block having a predetermined number of picture elements.

Thus, the thermal head 20 of FIG. 2 is scanned from left to right and, therefore, it has a certain directionality along its lengthwise direction. FIG. 2 shows the part of the thermal array 20 that is long enough to include two adjacent blocks 21 and 22 of resistive elements or picture elements. Each block 21 or 22 includes n' number of resistive elements 20a, and only one such element is shown in FIG. 2 as an example. Even though a pair of electrodes are provided for each of resistive elements on opposite sides of the thermal array, only those electrodes 21a or 22a on one side in each block are shown in FIG. 2. Each of the electrodes 21a and 22a is identified by 1', 2', ..., n' in the order of sequence of line scanning. It is to be noted that each of the electrodes 21a and 22a simply extends in the direction perpendicular to the lengthwise direction of the thermal array 20 from one side of the corresponding resistive element 20a.

As shown in FIG. 2, tape carriers 14a and 14b of the same type are provided for respective blocks 21 and 22. Tape carriers, as employed in the present invention, comprise an insulating film strip 23 on which are formed conductive paths 24, 25a and 25b, which are only partly shown in FIG. 2. Thus, electric current signals are supplied to the resistive elements 20a through the conductive paths 24, 25a or 25b and the electrodes 21a or 22a. IC chips 15a and 15b may be mounted on the respective tape carriers 14a and 14b as a control unit for activation and deactivation of the resistive elements 20a.

Suppose that the conductive paths 25a of the tape carrier 14a for connection with the corresponding electrodes 21a of the block 21 has the directionality which matches that of the thermal array 20 as shown in FIG. 2. This may be determined by the order of supplying current signals to the conductive paths on the tape carrier 14a. If the IC chip 15a is to be mounted on the tape carrier 14a, the directionality of the conductive paths 25a may be determined by that of the chip 15a since the chip 15a often includes a directional element such as a shift register. In the example shown in FIG. 2, the directionality is matched between the thermal array 20 and the tape carrier 14a.

Now, if the tape carrier 14b of the same type as the tape carrier 14a is provided for the block 22, there occurs discrepancy in directionality between the thermal array 20 and the tape carrier 14b as easily understood from FIG. 2. In order to rectify this problem, it is true that all the electrodes 21a and 22a may be provided on the same side of the thermal array 20. However, if the tape carrier 14b is provided on the same side as the tape carrier 14a, then it is required to make the tape carrier 14a longer to bring the connection site 25b away from the connection site 25a. Otherwise, the tape carriers 14a and 14b are short circuited through the conductive paths on the side substrate 13. So, to provide the tape carriers on the same side is disadvantageous since it requires to prepare two different types of tape carriers.

Alternatively, the IC chip 15b may be provided on the reverse side of the tape carrier 14b to obtain the required directionality matching between the tape carrier 14b and the thermal array 20. But, this again requires to prepare two different types of tape carriers, which is disadvantageous in manufacturing the thermal head device. Another disadvantage in this case is the difficulty in mounting the tape carrier having the IC chip on the reverse side onto the center substrate 12.

Figure 3:
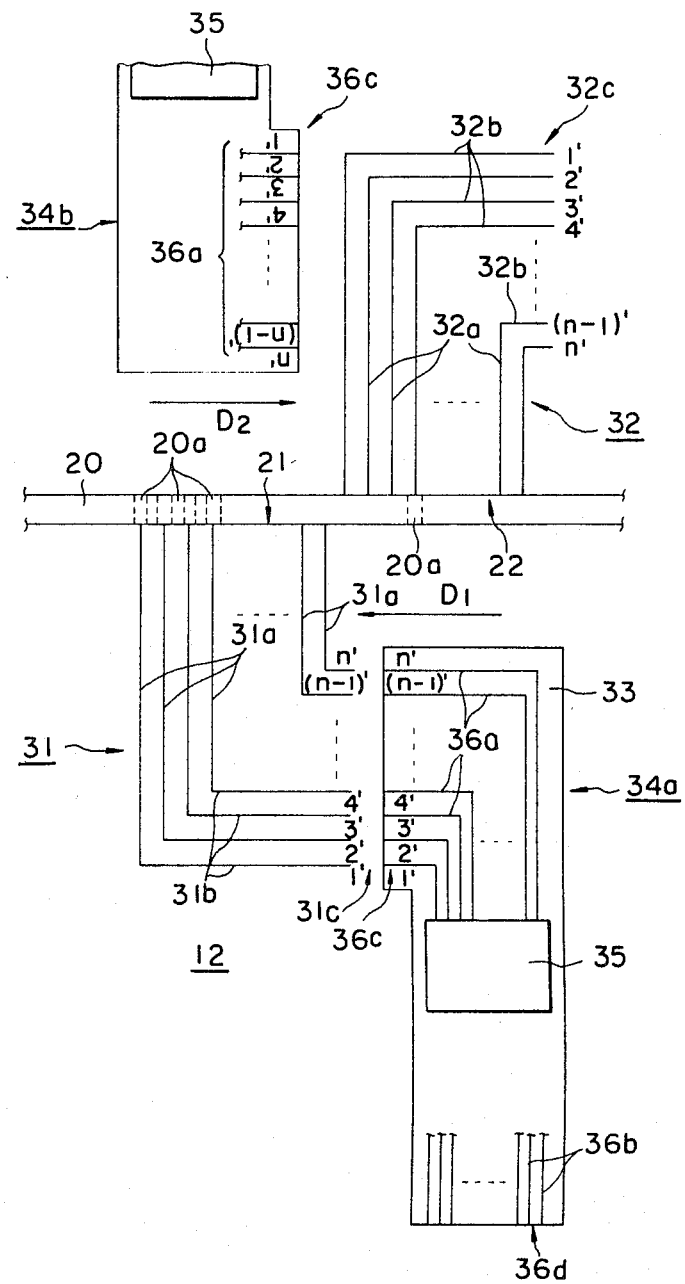
FIG. 3 is a schematic illustration showing the case where tape carriers of the same type may be used on both sides of the thermal array in accordance with the present invention.

Referring now to FIG. 3 which shows one embodiment of the present invention, tape carriers of the same and single type may be used advantageously. As clearly shown in FIG. 3, one feature of the present invention resides in the structure of electrodes 31 and 32 provided on the center substrate 12. That is, each of the electrodes 31 comprises a vertical section 31a, which extends perpendicularly with respect to the array 20 from the corresponding resistive element 20a, and a horizontal section which extends from the far end of the corresponding vertical section 31b in parallel with the array 20. Far ends 31c of the horizontal sections 31b are aligned in a line which is perpendicular to the array 20, and the ends 31c present contact points of the electrodes 31. Similarly, each of the electrodes 32 comprises a vertical section 32a and a horizontal section 32b, and the far ends 32c of the electrodes 32 are aligned in a line.

Considering the fact that the direction of line scanning is from left to right along the array 20, the contact line 31c or 32c has the directionality from the farthherest to the nearest with respect to the array 20 as shown by the primed numbers 1', 2' ..., and n'. Two tape carriers 34a and 34b, each to be used on the opposite side of the array 20, are shown in FIG. 3, and they are exactly alike structurally. The tape carrier 34a comprises an insulating film strip 33 and conductive paths 36a and 36b formed on the strip 33. The paths 36a and 36b may be directly connected or indirectly connected through an IC chip 35.

In the embodiment shown in FIG. 3, the conductive paths 36a of the tape carrier 34a are connected to the IC chip 35 at one end and the other ends 36c of the paths 36a are aligned in a line along a side portion of the film strip 33 to define a contact line. Such a contact line may be structured in such a manner that connection leads are provided to extend into the air beyond the side portion of the strip 33. Since the contact line 31c of the electrodes 31 matches the contact line 36c of the tape carrier 34a, they may be brought into contact to form electrical connections between the electrodes 31 and the corresponding conductive paths 36a. It might have been already noticed that the contact line 36c has the directionality as may be determined by the IC chip 35 as shown by the primed numbers, and it matches the directionality of the contact line 31c.

Although they are not fully shown in FIG. 3, the conductive paths 36b are connected to the IC chip 35 at one end, and the other ends are aligned along another side portion of the strip 33 to form another contact line 36d which is to be used for contact with external circuits. The other tape carrier 34b, which is exactly the same as the tape carrier 34a, is shown to be connected to the electrodes 32 of the block 22. The tape carrier 34b may be so positioned that the contact line 36c of the tape carrier 34b is in alignment with the contact line 32c of the electrodes 32, thereby forming electrical connections between the conductive paths 36a and the corresponding electrodes 32. It should, however, be noted that the tape carrier 34b is positioned on the electrodes 32 at least partially. Thus, the positioning of the tape carrier 34b is a superposing relationship with respect to the electrodes 32 as different from that of the tape carrier 34a, which is, so to speak, a face-to-face relationship with respect to the electrodes 31. A reader will immediately understand that no discrepancy exists in directionality between the contact line 36c of the tape carrier 34b and the contact line 32c of the electrodes 32. Thus, it is only necessary to prepare tape carriers of the same and single type in the present invention.

It is to be noted that the present invention is not limited to the particular electrode structure as described above. The present invention, in a broad sense, proposes to form a contact line at the far ends of the electrodes in one block, said contact line extending generally perpendicularly to the thermal array 22. Thus, the electrodes 31 and 32 may take any desired shapes in between as long as they are connected to respective resistive elements 20a of the thermal array at one end with the other ends aligned to form a required contact line.

Figure 5:
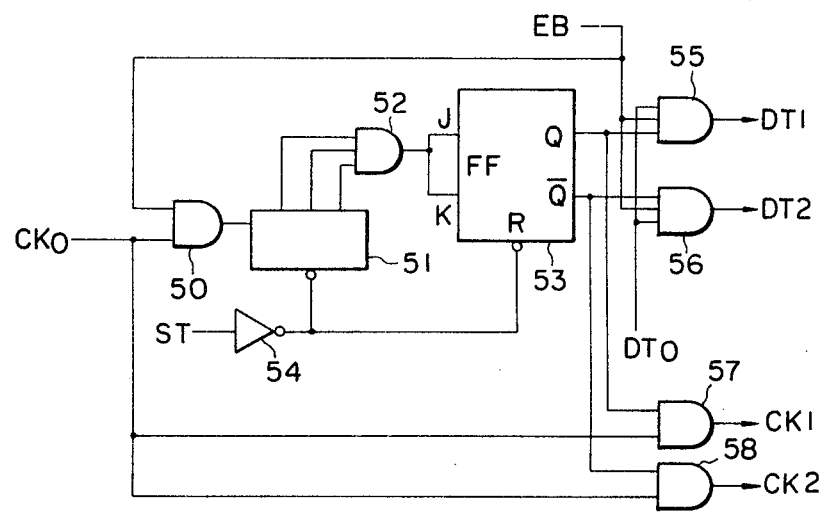
FIG. 5 is a schematic illustration showing another part of the driving circuit for distributing data signals appropriately to either side the thermal array.
Figure 4:
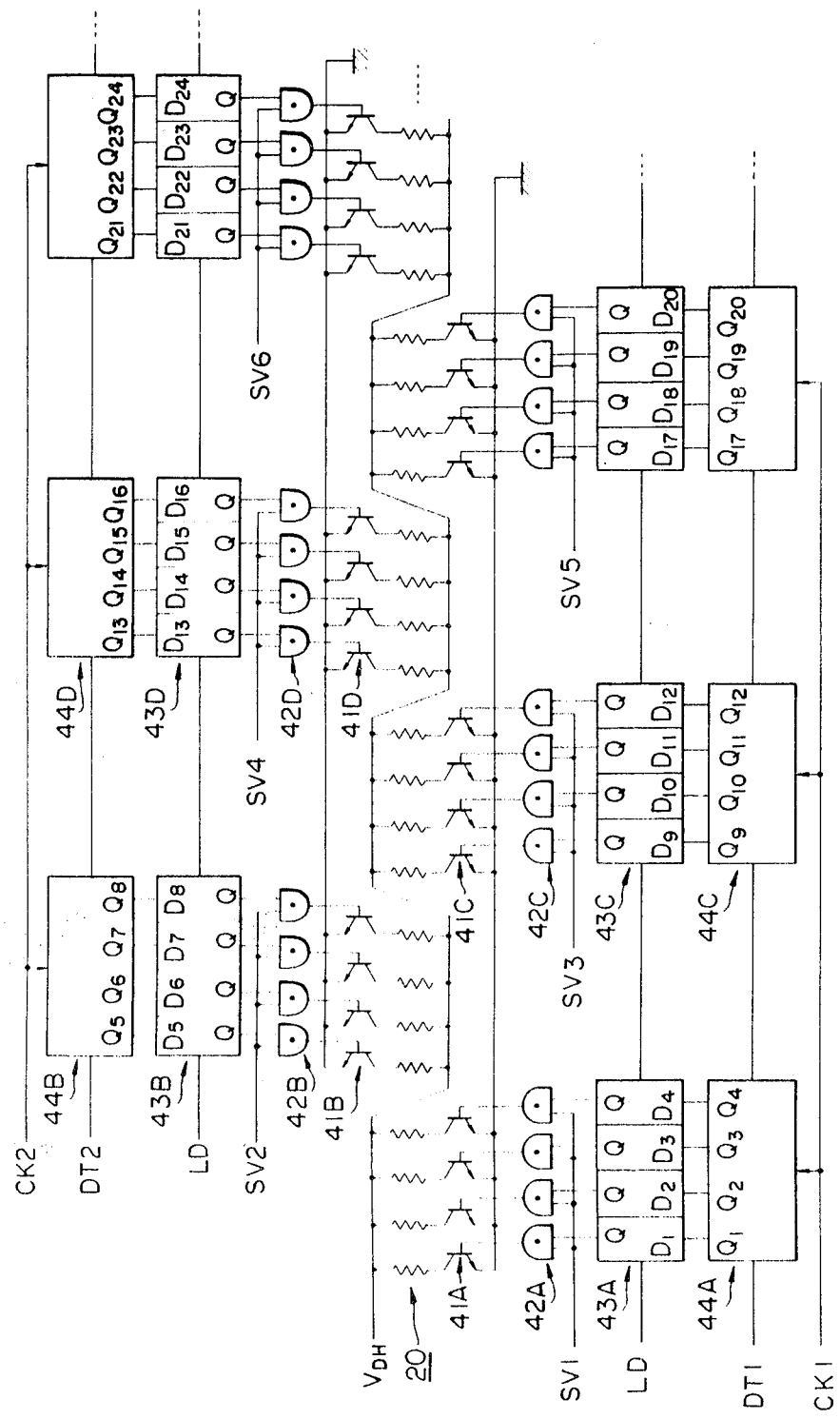
FIG. 4 is a schematic illustration showing a part of the driving circuit for individually activating or deactivating the resistive elements of the thermal array in accordance with the present invention.

With reference to FIGS. 4 and 5, it will now be described as to a circuit for controlling the driving or activation of the resistive elements 20a of the thermal array 20. A conventional approach has been to employ a diode matrix for controlling the passage of currents to the resistive elements 20a. However, this approach is disadvantageous since the diode matrix is complex in structure, and, therefore, expensive to make. The operational speed is also limited by a diode matrix which has relatively slower response characteristics.

In accordance with the present invention, a thermal head device comprises a plurality of resistive elements formed in a single array and grouped into a certain number of blocks, each block having a predetermined number of said resistive elements; first electrodes individually connected to said resistive elements and provided on one side of said array in one block and on the other side in the block adjacent to said one block; first circuit means including a plurality of block circuits for supplying signal currents to said resistive elements in accordance with the image information, each of said block circuits being connected to the first electrodes of the corresponding block and all of the block circuits connected to the first electrodes on the same side of said array being serially connected to form first and second series of the block circuits; second circuit means for distributing signals of the image information alternately to either of said first or second series of the block circuits every number of bits determined by the number of the resistive elements in each of said blocks; and third circuit means for switching the application of driving pulses between said first and second series of the block circuits of said first circuit means in association with the signal distribution of said second circuit means.

As shown in FIG. 4, the thermal array 20 includes a plurality of resistive elements 20a which are shown as resistors. The resistors 20a are grouped into blocks and each block has four resistors as illustratively shown in FIG. 4. A block circuit is connected to the resistors 20a in each block alternately on either side of the array 20, and the block circuit is comprised of driving transistors 41, AND gates 42, a buffer register 43 and a shift resistor 44. It is to be noted that the remaining sides of the resistors 20a are commonly connected to a voltage supply $V_{DH}$.

Explaining more in detail with reference to FIG. 4, transistors 41 of each block are individually connected to the resistors 20a thereby the transistors 41 function as switches for supplying driving currents to the resistors 20a. That is, the transistors 41 have their collectors individually connected to the resistors 20a and their emitters commonly grounded. The base of each of the transistors 41 is connected to the output of the corresponding AND gate 42. It is to be noted that any switching means may be substituted for bipolar transistors 41. For example, field effect transistors can be equally used.

One input of each of the AND gate 42 in each block is commonly connected and a strobe pulse SV for transferring data is supplied to the commonly connected inputs with an appropriate timing. The remaining inputs of the AND gates 42 in each block are individually connected to the corresponding bits of a buffer register 43, which is a parallel-in-parallel-out type register and data is read-in by a load signal LD. The data stored in a shift register 44 is transferred to the buffer 43 register bit to bit. The register 44 is a serial-in-parallel-out type register.

As shown in FIG. 4, every two shift registers, e.g., registers 44A and 44C, which are connected to the same side of the array 20, are connected in series and the remaining shift registers, e.g., registers 44B and 44D, are also connected in series. Thus, there are formed a pair of shift register chains whereby data is supplied to the shift register chains alternately and continuously in association with clock pulses CK1 and CK2. In other words, as will be made clear later with particular reference to FIG. 5, if data DT1, which is a part of a complete data DT., is first supplied to the lower shift register chain by the clock pulse CK1, then the next following data DT2, which is also a part of the data $DT_o$, is supplied to the upper shift register chain by the clock pulse CK2. It is to be noted that the resistors 20a may be provided more than 4 in each block and an appropriate number of shift register chains other than 2 may also be provided.

In operation, when the image information DT. is supplied, data of the first four picture elements is read into the shift register 44A by the clock CK1. Upon completion, data of the next four picture elements is read into the shift register 44B by the clock CK2. Thereafter, the contents of the shift register 44A are transferred to the shift register 44C and at the same time the still next four picture elements are read into the shift register 44A by the clock CK1. In this manner, all of the data $DT_o$, which may consist of information of one one line scan, will be read-in as divided in the pair of shift register chains. Then, the load signal is applied to each of the buffer registers 43 whereby the contents of each of the shift registers 44 are transferred into the corresponding buffer register 43.

After transferring the contents of the shift registers 44 to the buffer registers 43, strobe pulses SV are applied to the commonly connected inputs of the AND gates 42. It is to be noted that the strobe pulses SV may be applied in any desired manner. For example, if there are many resistive elements in one block, strobe pulses SV1, SV2, ..., SV6, ... for respective blocks are sequentially applied or fewer strobe pulses SV are applied to the corresponding blocks at the same time. On the other hand, if there are fewer resistive elements in one block, all of the strobe pulses SV are applied simultaneously or more strobe pulses SV are applied at one time.

Therefore, if the contents of each bit of the buffer register 43 in each block agree with the state of the strobe pulse applied to each block, the corresponding AND gate 42 supplies an output signal to the corresponding resistor 20a thereby producing heat therefrom. Suppose that the strobe pulses have two states, i.e., binary "0" and binary "1", and the contents of the registers 43 and 44 are also identified by the binary state "0" or "1". Then, if the four bits of the register 43A have the contents of (1, 0, 0, 1), the two end transistors in the transistor array 41A are turned on when the strobe pulse SV1="1" is applied to produce heat from the corresponding resistors 20a.

Description will now be had with respect to the production of signals DT1, DT2, CK1 and CK2 with particular reference to the block circuit shown in FIG. 5. The circuit of FIG. 5 is to distribute image information $DT_o$ by dividing it into two data signals DT1 and DT2 alternately and to produce clock pulses CK1 and CK2 for transferring the thus divided information signals. As shown, the image information distribution circuit includes 6 AND gates 50, 52, 55, 56, 57 and 58, counter 51, flipflop 53 and inverter 54.

A reference clock $CK_o$ from a reference clock pulse generator (not shown) is supplied to one input of the AND gate 50, whereas, a data enable signal EB, which allows to transfer the image information signal $DT_o$, is supplied to the other input. The output of the AND gate 50 is connected to the counter 51 to supply a driving signal. Every bit of the counter 51 is connected to the corresponding input of the AND gate 52 and it is so structured that the AND condition is satisfied when the count reaches a predetermined integer number k. In the example shown in FIG. 4, k=4, for example. An initiation signal ST is supplied to the counter 51 through an inverter 54 so that the counter 51 is cleared at the outset of each counting operation.

The output of the AND gate 52 is connected to the input of the flipflop 53, which is of the JK type so that an input signal is supplied to the JK terminal every k counts by the counter 51 to invert output signals at the outputs Q and $\overline{Q}$. The output Q of the flipflop 53 is connected to the AND gates 55 and 57 to supply input signals, and the output $\overline{Q}$ is connected to the AND gates 56 and 58 to supply input signals. The flipflop 53 is reset by the initiation signal ST applied through the inverter 54.

Each of the AND gates 55 and 56 has three inputs, one of which is connected to the flipflop 53 as described above. A second input to each of the AND gates 55 and 56 is the image information signal $DT_o$ and the remaining input is the data enable signal EB which permits the transferring of the image information signal $DT_o$. Output signals from the AND gates 55 and 56 are indicated as DT1 and DT2, respectively. Each of the AND gates 57 and 58 has two inputs, one of which is connected to the flipflop 53 and the other of which is supplied with the clock pulse $CK_o$. Output signals from the AND gates 57 and 58 are indicated as CK1 and CK2, respectively.

In operation, when the clock pulse $CK_o$ and the initiation signal ST are applied, the counter 51 is cleared and the flipflop 53 is reset so that the counter 51 starts the counting operation. When the counting reaches a predetermined integer number k, the AND condition of the AND gate 52 is satisfied to supply an output signal, which establishes the condition Q = "1" at the Q output of the flipflop 53. On the other hand, the other output $\overline{Q}$ has the conditions $\overline{Q}$ = "0". Under the circumstances, if the data enable signal EB is applied, the image information signal $DT_o$ passes through the AND gate 55 to provide the data signal DT1. This implies that the data signal DT1 is supplied to the lower shift register chain in FIG. 4. At the same time, since the AND condition of the AND gate 57 is also satisfied, the clock pulse CK1 is outputted from the AND gate 57.

Thereafter, the counter 51 starts its counting operation again and upon reaching the number k, the AND gate 52 supplies an output signal, which causes to invert the states at the outputs of the flipflop 53 thereby establishing the condition of Q = "0" and $\overline{Q}$ = "1". Under the conditions, with the application of the data enable signal EB, the image information signal $DT_o$ is now allowed to pass through the AND gate 56 to provide the data signal DT2. This implies that the data is now supplied to the upper shift register chain in FIG. 4. At the same time, since the AND condition of the AND gate 58 is satisfied, the clock pulse CK2 is provided by the AND gate 58.

As above described, in accordance with the present invention, the operation of the thermal head device is controlled by a combination of switching transistors and shift registers instead of a diode matrix. Moreover, the driving or controlling circuit is generally split into two portions to which the image information signal is supplied as divided. Therefore, the structure of the circuit is quite simplified and it can be easily designed on an IC chip thereby manufacturing cost may be substantially lowered. It is also to be noted that the speed of operation is greatly improved.

Figure 6:
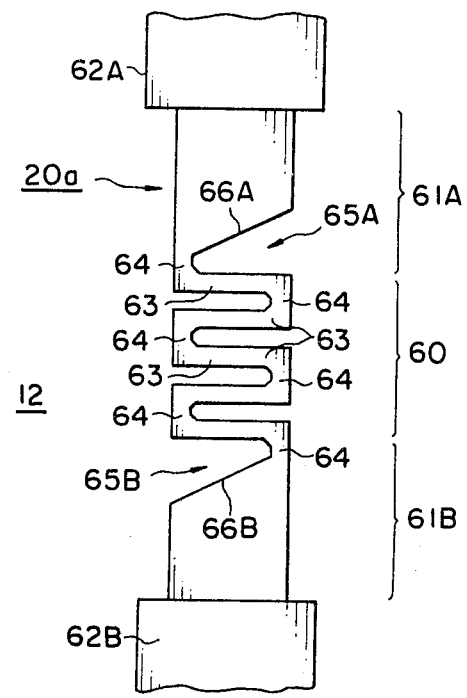
FIG. 6 is a schematic illustration showing a heat-producing resistive element of the thermal array in accordance with the present invention.
Figure 7:
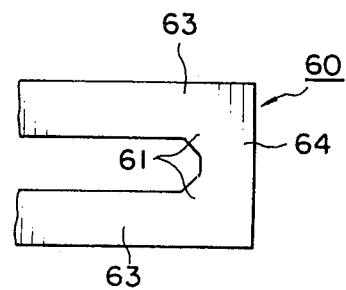
FIG. 7 is an enlarged view showing a part of the resistive element shown in FIG. 6.

Reference will now be made to FIGS. 6 and 7 and a preferred form of the resistive element 20a will be disclosed hereinbelow. In FIG. 6 is shown a single resistive element 20a, which comprises a central heating section and pre-heating sections on both sides of the heating section, extending between a pair of electrodes 62A and 62B. The element 20a is formed on the substrate 12 made of an insulating material such as ceramics or glass. It is to be noted that all of the sections 60, 61A and 61B have substantially the same length as measured in the lengthwise direction of the element 20a. Studies have shown that such equi-length structure can provide better heat-producing performances thereby allowing to obtain a visual reproduced image of high quality.

As shown, the central heating section 60 has a serpentine-like shape. More specifically, the section 60 comprises transverse portions 63 which extend transversely with respect to the element 20a and longitudinal portions 64 which extend longitudinally and each of which connect the two adjacent transverse portions 63. It is to be noted a cut-away portion 65A or 65B is provided between the center heating section 60 and either of the pre-heating sections 61A and 61B. Slant edges 66A and 66B are defined by the cut-away portions 65A and 65B on the pre-heating sections 61A and 61B, respectively. Provision of the cut-away portions 65A and 65B allow to separate the functions of the heating 60 and preheating 61A, 61B sections so that the heat response characteristics of the central heating section 60 are significantly improved.

FIG. 7 shows a part of the central heating section 60 on an enlarged scale, and, as shown, an auxiliary heating portion 67 is provided at each inside corner at the connection between the transverse 63 and longitudinal 64 portions. Provision of such auxiliary heating portions 67 allows to avoid the possible occurence of concentrated heating at the corner and to obtain uniform heating characteristics throughout the central heating section 60 so that a service life of the element 20a is prolonged. The auxiliary heating portion 67 shown in FIG. 7 has a triangular shape, but it is to be noted that any desired shape may be employed such as an arc shape.

Figure 8:
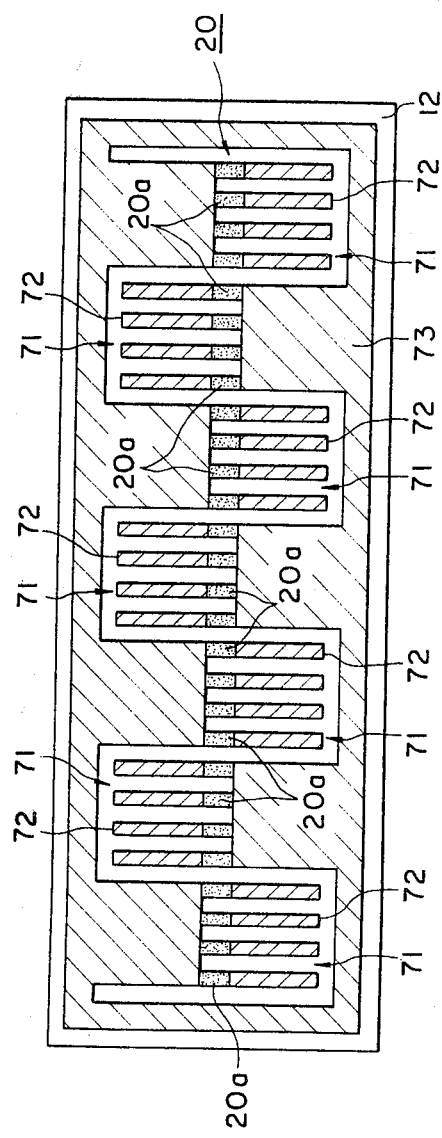
FIG. 8 is a top plan view schematically showing a particular structure of electrodes connected to respective elements of the thermal array in accordance with the present invention.

FIG. 8 shows a preferred electrode structure of the present invention. As shown, on the top surface of the insulating substrate 12 such as a glazed substrate are provided a plurality of heat-producing resistive elements 20a in a single line to form a thermal array 20. For the sake of simplicity, only 28 of such elements 20a are shown in FIG. 8, but, in a real facsimile machine, 1,728 of such elements 20a are required to scan the width of a DIN A4 size paper for the resolution of 8 elements per mm. The 28 resistive elements 20a are grouped into 7 blocks 71, each block 71 having 4 resistive elements 20a. Each element 20a has a pair of electrodes 72 and 73 which are connected to the opposite sides of the elements 20a. First electrodes 72 in each block 71 are disposed on the same side of the thermal array 20, and the side of providing the first electrodes 72 alternate from block to block. A common electrode 73 is formed on the substrate 12 as the opposite electrode in such a manner that it surrounds the resistive elements 20a and the first electrodes 72. The common electrode 73 is connected to all of the resistive elements 20a but it is not connected to any of the first electrodes 72.

With such an electrode structure as described above, the number of electrical connections required for the electrodes of the present invention becomes (n+1) with the n denoting the number of the resistive elements 20a and the 1 the number of the common electrode 73. Thus, the required number of electrical connections is significantly reduced in the present invention.

Figure 9:
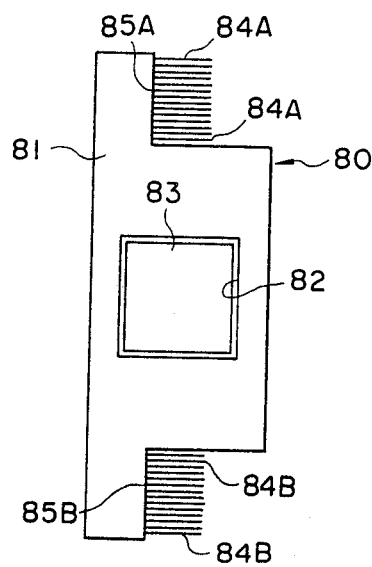
FIG. 9 is a top plan view showing a tape carrier having outer connection leads at a first position in accordance with the present invention.

Referring now to FIGS. 9 through 12, description will be given with respect to preferred tape carriers in accordance with the present invention. As shown in FIG. 9, the tape carrier 80 of the present invention is comprised of an insulating film strip 81 generally of a rectangular shape. A through-hole 82 generally of a square shape is provided at the center of the film strip 81 and an IC chip 83 is mounted as inserted in the hole 82. Although they are not shown in FIG. 9, conductive paths are formed on the surface of the film strip 81 and inner connection leads are provided as connected at the ends of the conductive paths in such a manner that the inner connection leads project inwardly into the hole 82 over a predetermined length. Thus, the IC chip 83 is mounted on the film strip 81 through connections with the inner connection leads.

The tape carrier 80 also comprises outer connection leads 84 which are connected to the respective conductive paths (not shown) formed on the film strip 81 and which extend into the air from side portions 85 of the film strip 81 over a predetermined length. Two groups of outer leads 84A and 84B are provided and these leads 84A and 84B are connected to the IC chip 83 through the conductive paths (not shown) and the inner connection leads (not shown). The leads 84B are to be connected to the conductive paths on the side substrate 13 and eventually to an external circuit. It is to be noted that the leads 84B extend linearly in the direction perpendicular to the lengthwise direction of the tape carrier 80. On the other hand, the leads 84A are to be connected to the individual electrodes of the thermal array 20 and they extend in the same direction as that of the leads 84B.

Figure 10:
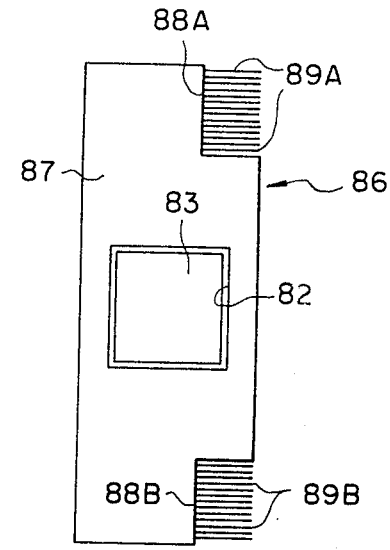
FIG. 10 is a top plan view showing a tape carrier having outer connection leads at a second position which is different from the first position shown in FIG. 9 in accordance with the present invention.

In accordance with the present invention, there is provided another tape carrier 86 which has substantially the same structure as the tape carrier 80 as shown in FIG. 10, wherein like numerals indicate like elements as practiced throughout this specification. As is obvious, the tape carrier 86 is different from the tape carrier 80 in the location of the side portions 88 and, accordingly, the outer connection leads 89. In other words, the location of the side portions 88 approximately corresponds to the line formed by the tip ends of the leads 84.

Figure 11:
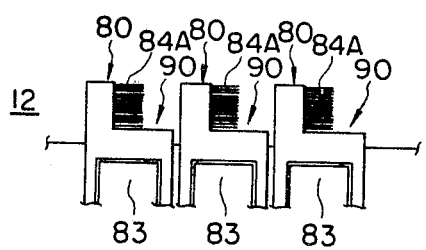
FIG. 11 is a schematic illustration showing the case where the tape carriers of FIG. 9 are arranged side-by-side.
Figure 12:
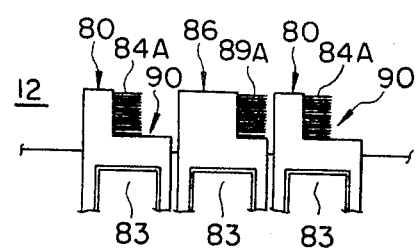
FIG. 12 is a schematic illustration when one of the tape carriers in FIG. 11 is replaced by the tape carrier of FIG. 10.

FIG. 11 shows the case where three of the tape carrier 80 shown in FIG. 9 are arranged side-by-side with the leads 84A individually connected to the electrodes (not shown) of the thermal array (not shown) formed on the substrate 12. Observation should be made that there is formed a void space 90 between the two adjacent tape carriers 80. Now, if the IC chip 83 of that tape carrier 80 arranged in the middle in FIG. 11 is damaged or malfunctions for some reasons, then the IC chip 83 in question is removed from the substrate 12. AS a replacing tape carrier, use may not be made of the tape carrier 80 because desired connections between the leads 84A and the electrodes on the substrate 12 may not be obtained. Accordingly, the tape carrier 86 is used as a replacing component and connected to the electrodes of the substrate 12 at a different location as shown in FIG. 12, thereby reliable and desired connections between the leads 89A and the electrodes may be obtained. It should be noted that the leads 89A are connected to the electrodes (not shown) of the substrate 12 at the location which corresponds to the void space 90.

It does not matter if the tape carriers 86 are first used and the tape carriers 80 are used as replacing components. Moreover, three or more types of tape carriers, each type having outer connection leads at a location different from the other types, may be advantageously used. This idea greatly facilitates the maintenance of the thermal head device.

FIGS. 13 through 16 show one example of a so-called multilayer tape carrier which is quite advantageous in the case where a large number of conductive paths are required. The tape carrier usually comprises a film strip usually made of an insulating material such as polyimide resin. However, if a multifunctional LSI chip is to be mounted on the tape carrier, a large number of conductive paths are required so that a stacked tape carrier comprised of at least two film strips placed one on another must be prepared.

Figure 13:
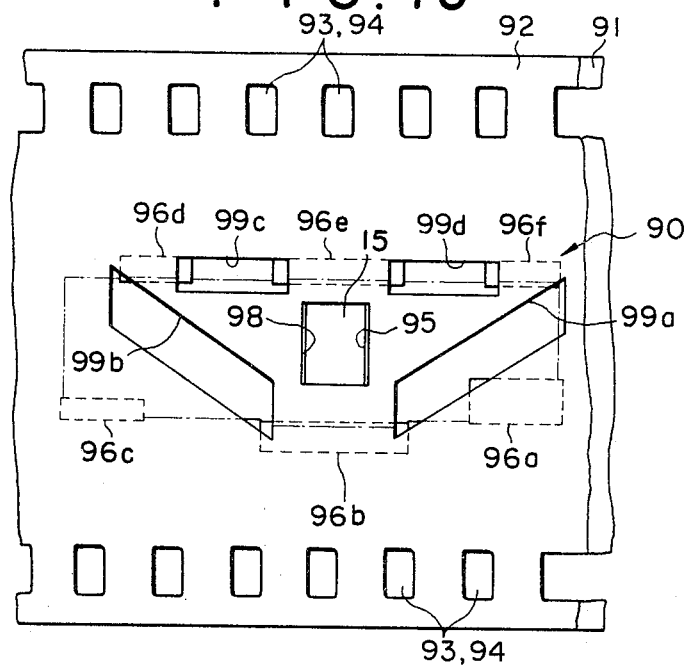
FIG. 13 is a top plan view showing the positional relationship between a pair of film strips stacked one on another.

As shown in FIG. 13, the stacked tape carrier 90 is formed by overlying two continuous film strips 91 and 92 one on the other and cutting along predetermined lines. Both of the strips 91 and 92 are made of polyimide resin and are provided with guide slots 93 and 94 spaced apart from each other along both sides of the strips.

Figure 14:
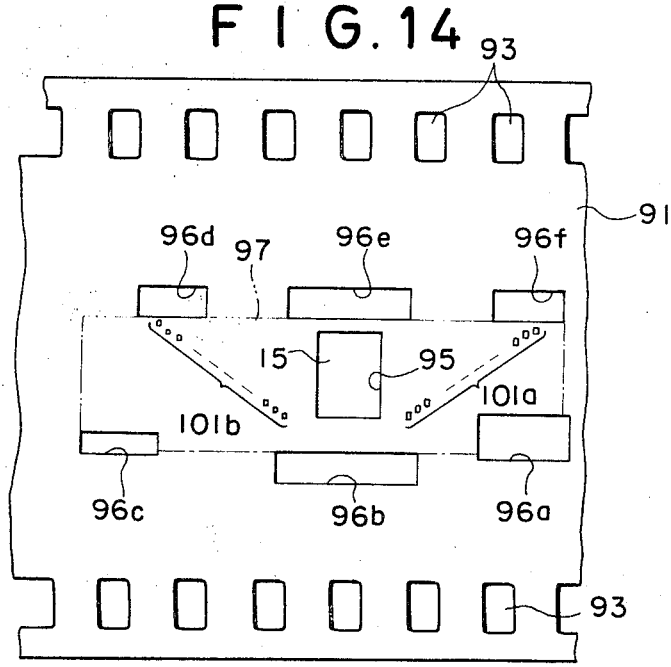
FIG. 14 is a top plan view showing one of the film strips shown in FIG. 13.

As shown in FIG. 14, the first film strip 91 is provided with an opening 95 at its center in which an electronic device 15 such as an IC chip is to be mounted. Around the device opening 95 is provided with 6 cutting openings 96a through 96f, each of which has a rectangular shape. A cutting line 97 is defined on the first film strip 91 in such a manner that the cutting line 97 forms a rectangular shape and it touches each of the six cutting openings 96a through 96f.

Figure 15:
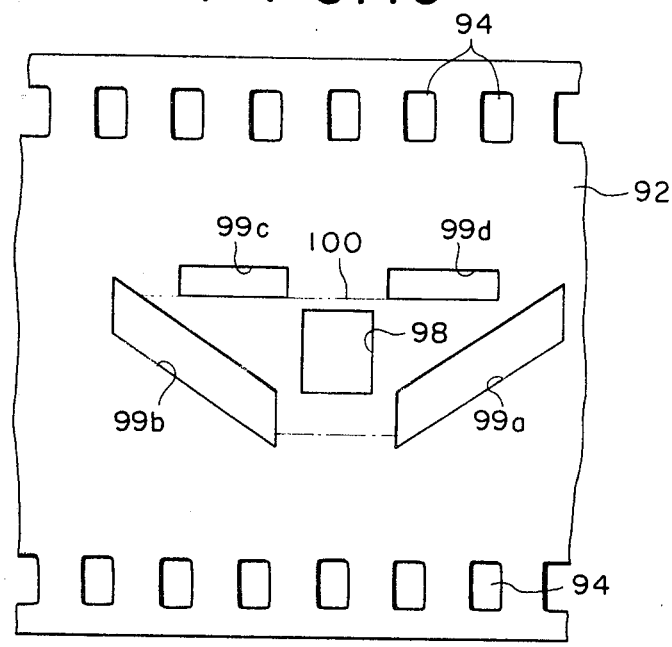
FIG. 15 is a top plan view showing the other of the film strips shown in FIG. 13.

The second film strip 92, details of which are shown in FIG. 15 and which is to be superposed on the first film strip 91, is also provided with a device opening 98 at the center. The device opening 98 is formed at the position aligned with the device opening 95 of the first film strip 91. Around the device opening 98 are provided with four cutting openings 99a through 99d. A cutting line 100 is defined on the strip 92, connecting all of the cutting openings 99a through 99d as shown by the one dotted line.

Although they are not shown in FIGS. 13 through 16, conductive paths as electrical connection lines are formed on each of the first and second film strips 91 and 92. For example, such conductive paths are formed by placing a thin metal film such as a copper film on each of the film strips 91 and 92, and by applying the well-known photolithographic technique for patterning. Input leads (not shown) and output leads (not shown) provided at the ends of the conductive paths of the first film strip 91 are provided in the terminal openings 96a and 96c, respectively. As shown, the terminal openings 96a and 96c are spaced apart from each other along the lengthwise direction of the film strip 91. Connection areas or pads 101a and 101b are provided in the conductive paths of the first film strip 91 arranged on both sides of the device opening 95 along the lines oblique to the lengthwise direction of the film strip 91.

Input leads (not shown) and output leads (not shown) of the conductive paths formed on the second film strip 92 are formed in the terminal openings 99a and 99b, respectively. Each of the terminal openings 99a and 99b has a shape of a parallelogram and is formed with their longer sides extending in the direction oblique to the lengthwise direction of the film strip 92 so that the leads formed in the openings 99a and 99b correspond in location to the respective pads 101a and 101b of the first film strip 91.

It will now be described as to a process for manufacturing the stacked tape carrier 90. First, with the use of a suitable blanking machine, device openings 95, 98 and cutting openings 96f through 96f (99a through 99d) are formed in the first film strip 91 (second film strip 92) by blanking. Then, a thin copper film is placed on each of the first and second film strips having the blanked openings, followed by patterning of the thin copper film with the application of photolithography to form conductive paths on each of the film strips in a desired pattern.

Figure 16:
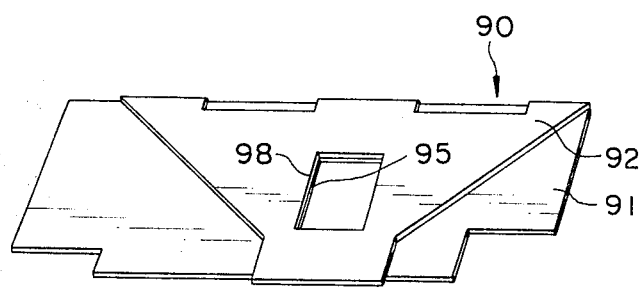
FIG. 16 is a perspective view of a stacked tape carrier in accordance with the present invention.

Thereafter, the electronic component 15 is mounted in the device opening 95 of the first film strip 91 and bonded thereto. The second film strip 92 is placed on the first film strip 91 in alignment therewith and the two strips 91 and 92 are bonded together at appropriate locations. Preferably, such bonding is carried out by fixing the input and output leads of the second film strip 92 to the pads 101a and 101b of the first film strip 91. Upon bonding, the second film strip 92 is cut along the cutting line 100, for example, by punching. In this instance, it is to be noted that only a single film strip is cut and no superposed portion of the first and second film strips 91 and 92 is cut because the cutting line 100 of the second film strip 92 is located within the cutting openings 96b and 96d through 96f of the first film strip 91. Then, the first film strip 91 is cut along the cutting line 97 thereby providing a completed tape carrier 90 comprised of the two film strips 91 and 92 stacked one on another as schematically shown in FIG. 16.

Another embodiment of the tape carrier in accordance with the present invention will be described with reference to FIGS. 17 through 19. FIG. 17 illustrates the positional relationship among the center substrate 12, tape carriers 113 and the side substrate 13. In FIG. 17, only those electrodes 112 provided on one side of the thermal array 20 are shown. The side substrate 13, preferably made of glass epoxy, has conductive paths 116 configured in a desired pattern only on one surface thereof for supplying driving power to the thermal array 20.

In FIG. 17, the conductive paths formed on the side substrate 13 are identified by a through h. For example, the paths a through d are for supplying four strobe pulses, path e for outputting data, path f for inputting data, path q for a reference potential as the ground and path h for a clock pulse. Paths a through d for strobe pulses are provided at one side as arranged side by side, and pulses are applied sequentially to the paths a through d. The data input path f is used to transfer the image information signal obtained by an image sensor (not shown) as serial digital signals corresponding to respective picture elements. These digital signals are transferred to the thermal array 20 through each of the IC chips 114 and to the next IC chip 114. That is, in order to arrange the image information signal serially, the signal is first fed from the path f to the IC chip of the tape carrier 113a and the signal is outputted to the path e which forms an input path to the tape carrier 113b. Similarly, the output path of the tape carrier 113b forms an input path to the tape carrier 113c, the output path of which formes an input path to the tape carrier 113d. As may be already understood, the paths e and f are used to connect the shift registers in the IC chips 114 in series, and, therefore, they must be arranged side by side.

Because of the particular requirement for positioning the input and output paths next to each other as described above, care must be taken in designing the patterning of conductive paths on the tape carrier 113. This is particularly critical if the input and output terminals of the IC chip 114 are not arranged side by side. In such an event, a cross-under or cross-over path is used to obtain a desired arrangement of the conductive paths at their ends.

Figure 18:
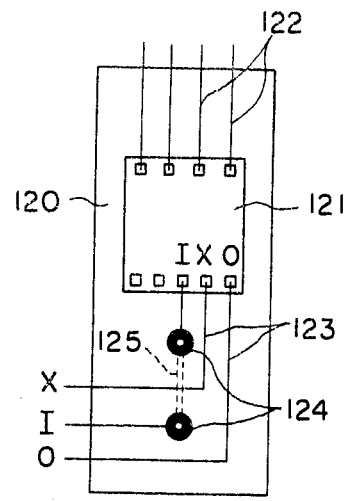
FIG. 18 is a schematic illustration of a tape carrier with a cross-under crossing.

FIG. 18 shows the case where a cross-under path is used. The tape carrier 120 has an IC chip 121 from which conductive paths 122 extend for connection with the thermal array 20. The other conductive paths 123 extend from the IC chip 121 for connection with the conductive paths 116; however, the input I and output O terminals of the IC chip 121 are not arranged next to each other. Thus, a pair of through-holes 124 are provided with a cross-under path 125, which runs on the reverse side of the tape carrier 120, is provided between the through-holes 124.

Figure 19A:
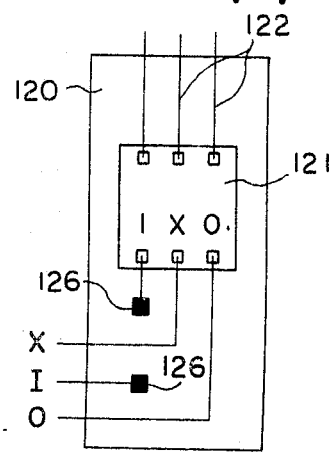
FIGS. 19(A) and (B) schematically show a tape carrier with a cross-over crossing.
Figure 19B:
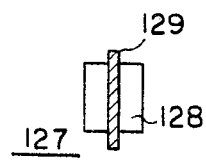

FIGS. 19(A) and (B) show the case where a cross-over path is used. Similarly in this case, the IC chip 121 does not have the input and output terminals which are arranged side by side. Thus, a pair of pads 126 are provided and cross-over path 127, comprised of an insulating film 128 and a connection lead 129 affixed on the film 128, is used to establish an electrical connection between the two pads without short-circuiting.

Figure 20:
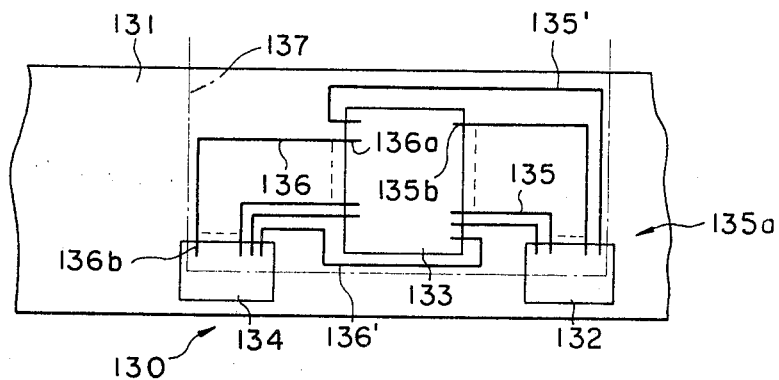
FIG. 20 is a top plan view showing one form of the tape carrier in accordance with the present invention.

FIG. 20 shows a further example of the tape carrier, which is particularly useful when an IC chip including electronic elements having different functions is to be mounted, in accordance with the present invention. Preferably, the IC chip includes a transistor array and a shift register. As shown in FIG. 20, the tape carrier 130 is manufactured by blanking openings 132 through 134 of a rectangular shape in a flexible film strip 131 of polyimide and by cutting the film strip 131 along the cutting line 137 after forming conductive paths 135 and 136 on the film strip 131.

The conductive paths 135 have outer connection leads 135a which stick into the opening 132 and the leads 135a are to be used for connection with electrodes of the thermal array. The conductive paths 135, at their opposite ends, have inner connection leads 135b which stick into the opening 133 for connection with an IC chip which is to be mounted in the opening 133. The conductive paths 136 have similar inner and outer connection leads 136a and 136b, respectively, but the outer leads 136b are to be connected to some external circuits.

As shown in FIG. 20, the tape carrier 130 is provided with conductive paths 135' and 136' which partly extend around the opening 133 into which an IC chip is to be mounted. These extended conductive paths 135' and 136' are especially useful if the IC chip to be mounted has different functional elements such a driving transistor array and a shift register. It is to be noted that such an extended conductive path may also be provided to extend between the openings 132 and 134, if desired.

Figure 21:
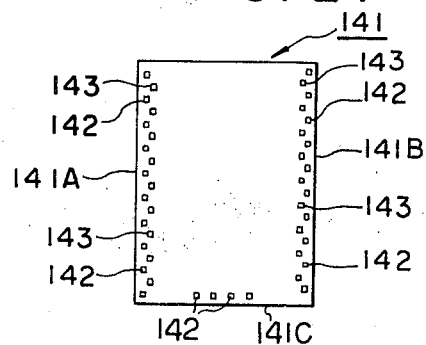
FIG. 21 is a bottom plan view of an IC chip showing contact electrodes arranged in a staggered relationship along both sides.
Figure 22:
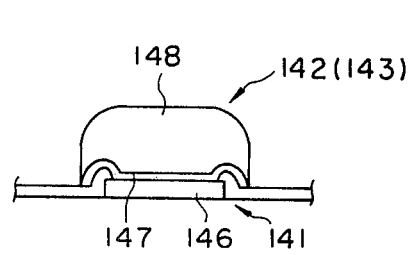
FIG. 22 is an enlarged view of a contact electrode of the IC chip shown in FIG. 21.

A further embodiment of the tape carrier in accordance with the present invention is shown in FIGS. 21 through 26. FIG. 21 shows an IC chip 140 which is particularly suitable to be mounted on this embodiment of the tape carrier. As shown, on the bottom surface of the IC chip 140 are provided input electrodes 142 along three sides 141A, 141B and 141C of the chip 141, output electrodes 143 along the sides 141A and 141B arranged in a staggered relationship with the input electrodes 142. A typical example of these electrodes 142 and 143 is shown on an enlarged scale in FIG. 22. As shown, a pad 146 is formed on the bottom surface of the chip 141 and a connection layer 147 comprised of a metal such as Cr-Cu or Cr-Ag is formed on the pad 146 with a bump electrode 148 projectingly formed by Au on the connection layer 147.

Figure 23:
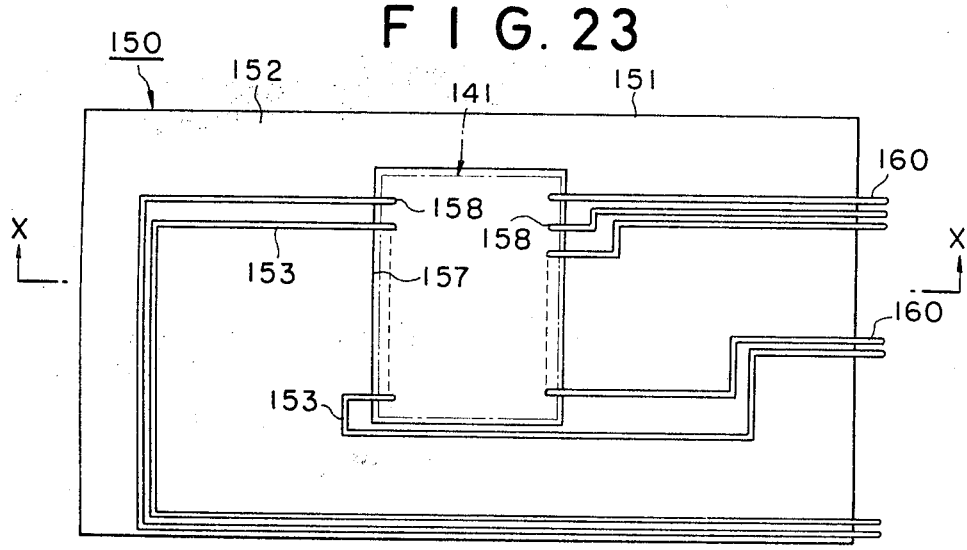
FIG. 23 is a top plan view schematically showing one embodiment of the tape carrier in accordance with the present invention, on which the IC chip of FIG. 21 may be mounted.
Figure 24:
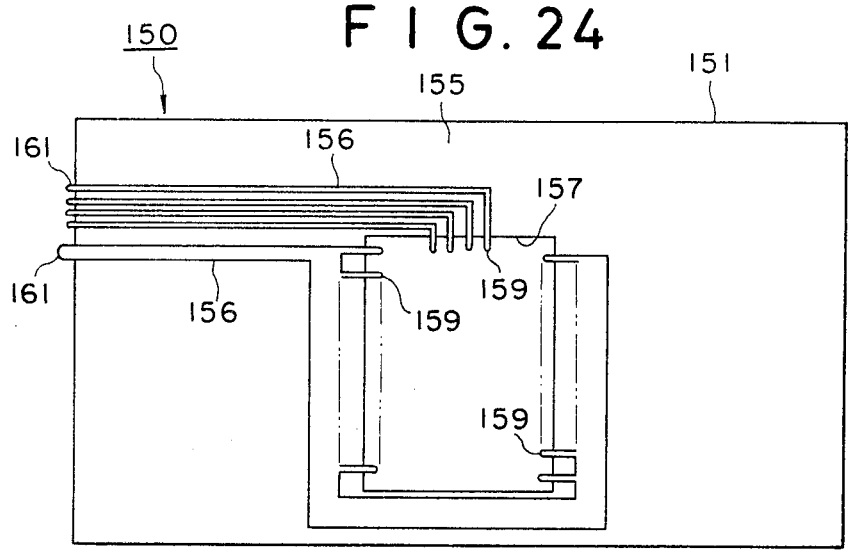
FIG. 24 is a bottom plan view schematically showing the bottom surface of the tape carrier shown in FIG. 23.
Figure 25:
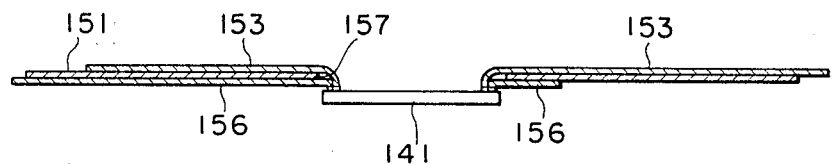
FIG. 25 is a cross-sectional view of the tape carrier taken along X—X line shown in FIG. 23.
Figure 26:
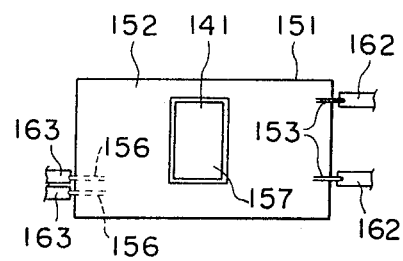
FIG. 26 is a schematic illustration on a reduced scale showing how the outer connection leads of the tape carrier are connected to electrodes of the resistive elements in a thermal array and to conductive paths on a side substrate.
Figure 27:
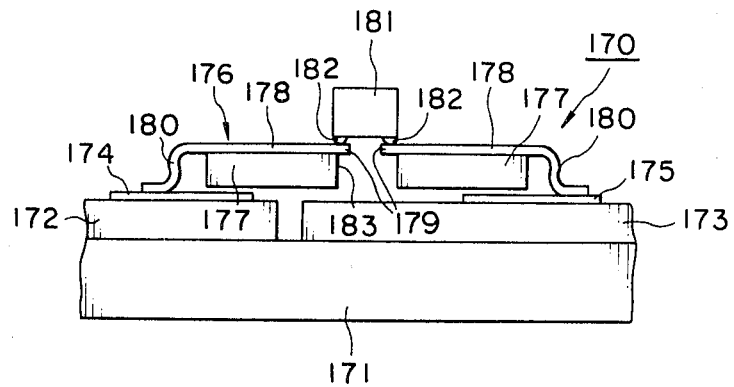
FIG. 27 is a schematic illustration showing a part of the prior art thermal head device.

A modified tape carrier 150 as best shown in FIGS. 23 and 24 comprises a film strip 151 the top surface 152 of which is provided with output conductive paths 153 for connection with the output electrodes 143 of the IC chip 141. On the other hand, the bottom surface 155 of the film strip 151 is provided with input conductive paths 156 which are to be connected to the input electrodes 142 of the chip 141. An opening 157 for mounting therein the IC chip 141 is provided approximately at the center of the film strip 151, and inner connection leads 158 provided at end portions of the input paths 153 stick into the opening 157 over a predetermined length. The other inner connection leads 159 provided at end portions of the output paths 156 also stick into the opening 157 over a predetermined length but at locations different from the leads 158. It is to be noted that outer connection leads 160 provided at the other end portions of the output paths 153 and outer connection leads 161 provided at the other end portions of the input paths 156 are provided along opposite sides of the film strip 151 with respect to each other. It is also to be noted that the leads 158 are longer than the leads 159 so that the leads 158 may be brought into contact with the electrodes 143 with the leads 159 connected to the electrodes 142. A careful viewer will notice that the leads 160 are longer than the leads 161 so that the leads 160 may be bent around the edge of the film strip 151 for connection with electrodes 162 of the thermal array as schematically shown in FIG. 26. Also as shown in FIG. 26, the input paths 156 are connected via the leads 161 to driving electrodes, from which driving signals are fed to the chip 141 through the paths 156. As may be understood, the tape carrier 150 is advantageous in that there is no need to provide through-holes. A further modification of the present invention will now be described with reference to FIGS. 27 through 31. FIG. 27 shows a typical structure of the prior art thermal head device 170 which comprises a support plate 171 on which are mounted a center substrate 172, preferably of ceramics, and a side substrate 173, preferably of glass epoxy, spaced apart from each other. A thermal array (not shown) is provided on the center substrate 172 and electrodes 174 are provided on the substrate 172 as connected to the thermal array. Conductive paths 175 are provided on the side substrate 173 which is a driving side of the device 170.

A tape carrier 176 provides electrical connections between the electrodes 174 and the driving conductive paths 175. The tape carrier includes an insulating film 177 and conductive paths 178 formed on the film 177. Inner connection leads 179 and outer connection leads 180 are provided on both ends of the conductive paths 178. A diode away chip 181 is mounted on the tape carrier 176 through contact between the bumps 182 of the chip 181 and the inner leads 179 which stick into an opening 183 of the tape carrier 176.

It should be noted that in accordance with the prior art technique, the chip 181 is mounted on the tape carrier 176 with the surface having bumps 182 facing downward. However, the chips 181 before being mounted on the tape carrier 176 are usually stored with the surface having bumps facing upward in order to avoid contact with oil or debris, or formation of scratches. As a result, the chips 181 must be turned upside down to be mounted on the tape carrier 176, which tends to complicate the manufacturing process of the tape carrier 176.

One might think, therefore, that the above-noted drawbacks could be easily overcome by mounting the chip 181 onto the tape carrier 176 with the bump side surface facing upward. However, if the chip 181 is mounted in the opening 183 with the bump side surface facing upward with the bumps 182 in contact with the inner leads 179, a portion of the chip 181 downwardly projects out of the opening 183 since the chip 181 is generally thicker than the film strip 177 of about 125 μm thick. This could cause malconnections between the bumps 182 and the leads 179.

Figure 28:
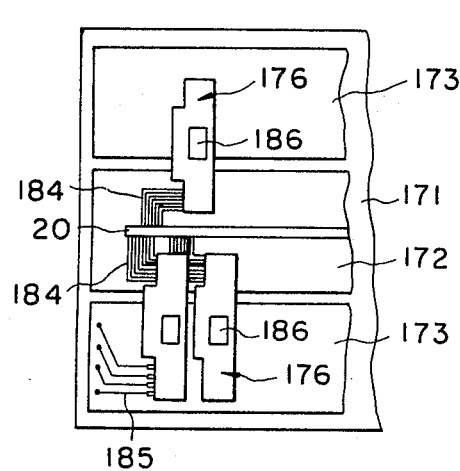
FIG. 28 is a top plan view schematically showing a part of the thermal head device in accordance with the present invention.

The present invention is also directed to obviate the drawbacks of the prior art as described above and an embodiment of the present invention will be disclosed in detail with reference to FIGS. 28 through 31. As shown in FIG. 28, the center substrate 172 and the two side substrates 173 are mounted on the support plate 171. The thermal array 20 including a plurality of resistive elements (not shown) arranged in a single line is formed on the center substrate 172. Electrode blocks 184, each including, for example, 32 electrodes individually extending from the resistive elements of the thermal array 20, are provided on both sides of the array 20 in a staggered arrangement. Exemplary conductive paths 185 for supplying driving signals to the thermal array 20 through the tape carrier 176 are shown on the side substrate 173.

Figure 31:
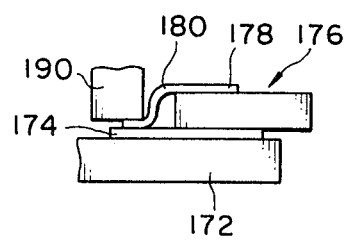
FIG. 31 is an enlarged view showing a part of the device shown in FIG. 30.

The outer leads 180 of the tape carrier 176 are to be connected to the electrodes 174 of each block 184 at one end and to the conductive paths 185 at the other end. Each block 184 includes 32 electrodes 174 which are spaced apart at a distance of about 120 μm from each other. In contrast, the distance between the two adjacent paths 185 is about 600 μm which is many times larger than that of the electrode block 184. Thus, when forming electrical connections between the electrodes 174 of each block 184 and the leads 180 of the tape carrier 176, the leads 180 are first aligned with the electrodes 174 with the use of a microscope and a bonding tool 190 is brought downward under pressure to fix the leads 180 onto the electrodes 174 as shown in FIG. 31. However, since the electrodes 174 are crowded, a careful bonding operation is required, and if the initial gap between the electrodes 174 and the leads 180 where alignment is obtained is relatively large, there is a chance of bringing about misalignment when the tool 190 is brought downward.

Figure 29:
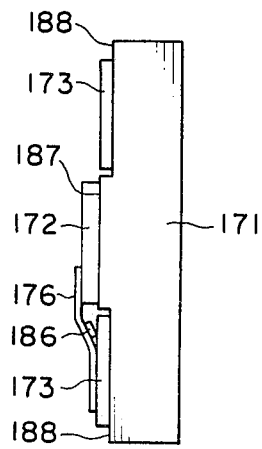
FIG. 29 is a side elevational view of the device shown in FIG. 28.

Therefore, in accordance with the present invention, as best shown in FIG. 29, the support plate 171 is so structured to have an upper top surface 187 and a lower top surface 188 located on opposite sides of the upper top surface 187. The center substrate 172 is adhered to the upper top surface 187 and the side substrates 173 are adhered to the respective lower top surfaces 188. As a result, the top surface of either of the substrates 173 is at a level lower than the top surface of the substrate 172. An IC chip 186 is mounted in the opening 183 of the tape carrier 176 with its bump side surface facing upward. Even if the IC chip 186 is thicker than the film strip 177 so that a portion of the chip 186 projects out of the tape carrier 176 as best shown in FIG. 29, no inconveniences will be brought about since a enough space is defined by the stepped structure of the support plate 171 to accommodate such a projecting portion of the chip 186. And, therefore, the chip 186 does not need to be turned upside down when being mounted onto the tape carrier 176.

Figure 30:
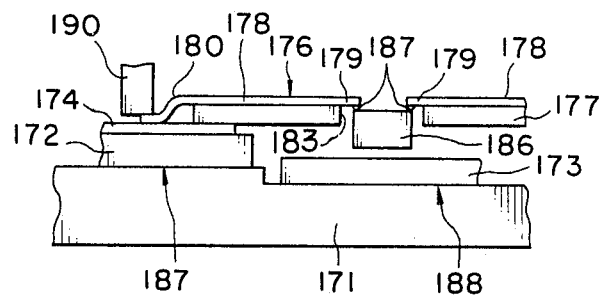
FIG. 30 is a schematic illustration showing a part of the thermal head device embodying the present invention, with the IC chip in a preferred orientation.

As shown in FIG. 30, when the tape carrier 176 is aligned as desired, the lead 180 is located above the corresponding electrode 174 just by the thickness of the film strip 177 so that a chance of losing alignment during bonding operation by means of the tool 190 is virtually eliminated. It should also be noted that the IC chip 186 is located above the side substrate 173 without contact. Furthermore, instead of providing a stepped support plate, the thickness of the center substrate 172 may be made different from that of the side substrate 173 to obtain substantially the same effects. Advantages are also attained by providing a recessed portion in the side substrate 173 to accommodate the projecting portion of the chip 186.

Description will now be had with respect a process of manufacturing a thermal head device without turning an IC chip upside down with reference to FIGS. 32(A) through (G).

Figure 32A:
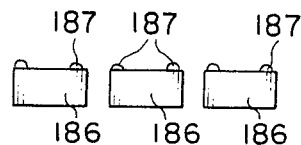
FIGS. 32(A) through (F) show process steps of manufacturing the thermal head device in accordance with one embodiment of the present invention.
Figure 32B:
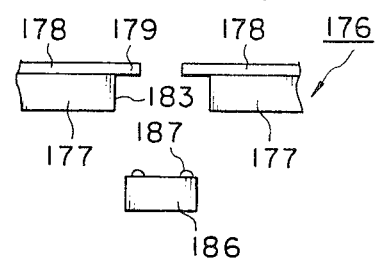
Figure 32C:
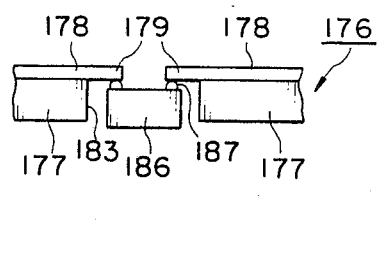
Figure 32D:
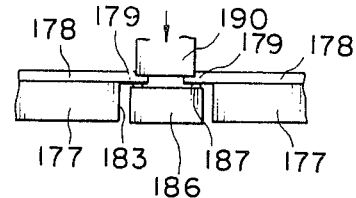
Figure 32E:
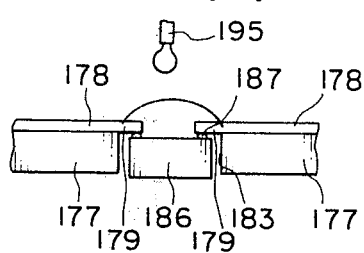
Figure 32F:
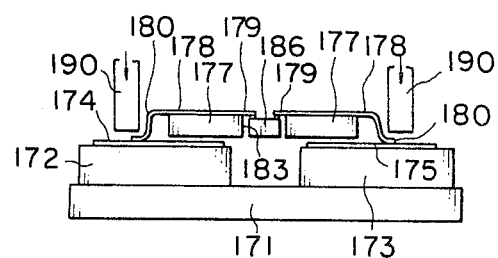

Before being mounted onto a tape carrier, IC chips 186 are stored with the surface having bumps 187 facing upward as resting on a store plate as shown in FIG. 32(A). Then, as shown in FIG. 32(B), the IC chip 186 is brought into alignment with the opening 183. Upon inserting the chip 186 into the opening 183 to bring the bumps 187 into contact with the respective leads 179 as shown in FIG. 32(C), the bonding tool 190 is pressed against the leads 179 from above to form a pressure contact therebetween as shown in FIG. 32(D). Thereafter, as shown in FIG. 32(E), a resin material is dropped from a nozzle 195 to form a resin seal around the thus formed contacts. Finally, as shown in FIG. 32(F), the outer leads 190 are pressed down by the tool 190 onto the electrodes 174 and the conductive paths 175 firmly to form pressure contacts. As described above, this process is advantageous since it does not involve a step of turning an IC chip upside down.

While the above provides a full and complete disclosure of the preferred embodiment of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A thermal head device for converting electrical signals, containing an image information, into heat signals to obtain a visual image on a medium such as a thermosensitive paper comprising:
   a first substrate;
   a plurality of resistive elements formed on said first substrate in the form of a single array having a lengthwise direction, said resistive elements being grouped into blocks, each block having a predetermined number of said resistive elements;
   a plurality of first electrodes individually connected to a respective resistive element(s) in each of said blocks, all of said first electrodes in one block being provided on the same side of said array with the positions of said first electrodes alternating from side to side relative to said array from block to block, said first electrodes in one block including at least horizontal sections which extend approximately in parallel with the lengthwise direction of said array to define at the end portions of said horizontal sections a group of contacts along an imaginary first contact line extending substantially perpendicularly to the lengthwise direction of said array so that said first contact line is defined on both sides of said array in an alternating manner with a pitch corresponding to the number of blocks defined along said array;
   second electrode means provided in opposed relation against said first electrodes with respect to said array; and
   interconnection means mounted on said first substrate with one for each block, said interconnection means having a group of contacts along a second imaginary contact line matchingly contactable with the corresponding first contact line and a predetermined number of conductive paths for forming interconnections between an external circuit and said contacts along said second contact line.

2. The device of claim 1 wherein said second electrode means is a common electrode connected to a reference voltage.

3. The device of claim 1 wherein each of said first electrodes include a vertical section extending approximately perpendicular to the lengthwise direction of said array thereby connecting the corresponding resistive element to the corresponding horizontal section.

4. The device of claim 1 wherein said interconnection means is comprised of an insulating film strip and conductive paths formed on said film strip.

5. The device of claim 4 wherein an electronic component is mounted on said film strip whereby said conductive paths are electrically connected to the internal circuit of said electronic component.

6. The device of claim 1 further comprising driving means for driving said plurality of resistive means, said driving means including:
   first circuit means provided for each block of said resistive elements as connected therewith for driving said resistive elements to produce heat in accordance with the image information; and
   second circuit means for distributing the image information signal as appropriately divided to said first circuit means.

7. The device of claim 6 wherein said first circuit means of each block include transistors corresponding in number and individually connected to said resistive elements and a shift resister having the corresponding number of bits whereby the signal in each of said bits is supplied to the base of the corresponding transistor.

8. The device of claim 7 wherein said shift registers of alternate blocks are serially connected to form a pair of shift register chains and the image information signal is supplied as divided to said pair of shift register chains alternately every predetermined number of bits whereby the signals as supplied are transferred along the respective shift register chains by means of said second circuit means.

9. The device of claim 8 wherein said second circuit means include counter means to which a reference pulse is supplied and switching means for switching the flow of the image information signal to either of said shift register chains in association with the output from said counter means.

10. The device of claim 1 wherein each of said resistive elements is comprised of a central heating section and pre-heating sections provided on opposite sides of said central heating section, which is in a serpentive-like shape to effectively increase the electrical resistance.

11. The device of claim 10 wherein a cut-away portion is provided between the heating and pre-heating sections thereby eliminating the interaction between them.

12. A thermal head device for use in a facsimile machine and the like as an output device comprising:
a substrate made of an insulating mateiral;
a thermal array formed on said substrate by a plurality of resistive elements arranged along a line, said resistive elements being selectively activated to produce heat in accordance with the image information signal received; and
a plurality of tape carriers for providing electrical interconnections between said resistive elements and external circuits, each of said tape carriers including conductive means and insulating means for carrying thereon said conductive means with an electronic component mounted on each of said tape carriers.

13. The device of claim 12 wherein said conductive means comprises a conductive path and a connection lead provided at least at one end of said conductive path and said plurality of tape carriers have at least two types which are different in location of said connection lead.

14. The device of claim 12 wherein said tape carriers are of the stacked type in which two or more insulating film strips are placed on top of another with each of said insulating film strips carrying thereon conductive paths.

15. The device of claim 12 wherein said conductive means comprises at least one cross-under or cross-over path.

16. The device of claim 12 wherein said insulating means is an insulating film strip provided with an opening and first conductive paths are provided on a first surface of said film strip with first inner connection leads extending from said first conductive paths into said opening whereby an electronic component is mounted in said opening and has bumps in contact with said first inner connection leads.

17. The device of claim 16 wherein second conductive paths are also provided on a second surface of said film strip, said second surface being the opposite surface of said first surface, and second inner connection leads also extend from said second conductive paths into said opening whereby said second inner connection leads are also in contact with the corresponding bumps of said electronic component.

* * * * *

UNITED STATES PATENT AND TRADEMARK OFFICE
CERTIFICATE OF CORRECTION

PATENT NO. : 4,405,929

DATED : September 20, 1983

INVENTOR(S) : Osamu Sugano

It is certified that error appears in the above—identified patent and that said Letters Patent is hereby corrected as shown below:

Add the following claims 18-30:

--18. The device of claim 12 wherein said electronic component is an IC chip.--

--19. The device of claim 18 wherein said IC chip includes a plurality of transistor switching means which are electrically and individually connected to the corresponding ones of said resistive elements.--

--20. The device of claim 19 wherein said IC chip further includes a shift register having bits corresponding in number to said transistor switching means.--

--21. A thermal head device comprising:

a first substrate;

a plurality of electrically resistive elements formed on said first substrate in the form of a single array having a lengthwise direction, said resistive elements being grouped into blocks, each block having a predetermined number of said resistive elements;

a plurality of first electrodes formed on said first substrate and individually connected to a respective resistive element in each of said blocks, all of said first electrodes in one block being provided on the same side of said array, said first electrodes in one block including at least horizontal sections which extend approximately in parallel with the lengthwise direction of said array to define at the end portions of said horizontal sections a group of contacts along an imaginary first contact line extending substantially perpendicularly to the lengthwise direction of said array;

second electrode means formed on said first substrate in opposed relation against said first electrodes with respect to said array; and

UNITED STATES PATENT AND TRADEMARK OFFICE
CERTIFICATE OF CORRECTION

PATENT NO. : 4,405,929

DATED : September 20, 1983

INVENTOR(S) : Osamu Sugano

It is certified that error appears in the above—identified patent and that said Letters Patent is hereby corrected as shown below:

interconnection means at least partly mounted on said first substrate with one for each block, said interconnection means having a group of contacts along a second imaginary contact line matchingly contactable with the corresponding first contact line and a predetermined number of conductive paths for forming interconnections between an external circuit and said contacts along said second contact line.--

--22. The device of claim 21 wherein said second electrode means is a common electrode connected to a reference voltage.--

--23. The device of claim 21 wherein each of said first electrodes include a vertical section extending approximately perpendicular to the lengthwise direction of said array thereby connecting the corresponding resistive element to the corresponding horizontal section.--

--24. The device of claim 21 wherein said interconnection means comprises an insultating film strip and conductive paths formed thereon.--

--25. The device of claim 21 wherein said interconnection means further comprises an electronic component mounted on said film strip which is electrically connected to at least some of said conductive paths formed on said film strip.--

--26. The device of claim 25 wherein said electronic component is an IC chip.--

--27. The device of claim 26 wherein said IC chip includes a plurality of transistor switches which are electrically and individually connected to the corresponding ones of said resistive elements.--

--28. The device of claim 21 further comprising a second substrate arranged spaced apart from said first substrate and having thereon a plurality of connection lines, said interconnection means being mounted as bridging between said first and second substrates whereby said conductive paths of said interconnection means are connected to the external circuit through said connection lines of said second substrate.--

UNITED STATES PATENT AND TRADEMARK OFFICE
CERTIFICATE OF CORRECTION

PATENT NO. : 4,405,929

DATED : September 20, 1983

INVENTOR(S) : Osamu Sugano

It is certified that error appears in the above—identified patent and that said Letters Patent is hereby corrected as shown below:

--29. The device of claim 28 wherein said first substrate is a glazed ceramic plate and said second substrate is a glass epoxy plate.--

--30. The device of claim 28 further comprising a support plate for supporting thereon said first and second substrates.--

Signed and Sealed this

Twentieth Day of December 1983

[SEAL]

Attest:

GERALD J. MOSSINGHOFF

Attesting Officer

Commissioner of Patents and Trademarks